(12) United States Patent
Wang et al.

(10) Patent No.: US 11,495,608 B2
(45) Date of Patent: Nov. 8, 2022

(54) MULTI-FINGER GATE NONVOLATILE MEMORY CELL

(71) Applicant: GLOBALFOUNDRIES Singapore Pte. Ltd., Singapore (SG)

(72) Inventors: Lanxiang Wang, Singapore (SG); Eng Huat Toh, Singapore (SG); Shyue Seng Tan, Singapore (SG); Xinshu Cai, Singapore (SG); Yongshun Sun, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 140 days.

(21) Appl. No.: 16/945,946

(22) Filed: Aug. 3, 2020

(65) Prior Publication Data

US 2022/0037343 A1 Feb. 3, 2022

(51) Int. Cl.
*H01L 27/11521* (2017.01)
*G11C 16/04* (2006.01)
*H01L 27/11558* (2017.01)

(52) U.S. Cl.
CPC .... *H01L 27/11521* (2013.01); *G11C 16/0416* (2013.01); *H01L 27/11558* (2013.01)

(58) Field of Classification Search
CPC ......... H01L 27/11521; H01L 27/11558; G11C 16/0416
See application file for complete search history.

(56) References Cited

U.S. PATENT DOCUMENTS 7,099,192 B2 8/2006 Wang et al.
7,859,043 B2 * 12/2010 Pikhay ................ H01L 29/7883
257/314

* cited by examiner

*Primary Examiner* — Allison Bernstein
(74) *Attorney, Agent, or Firm* — David Cain (57) ABSTRACT

A nonvolatile memory device is provided. The device comprises a floating gate having a first finger and a second finger and an active region below the floating gate fingers. A first doped region is in the active region laterally displaced from the first floating gate finger on a first side. A second doped region is in the active region laterally displaced from the first floating gate finger on a second side. A third doped region is in the active region laterally displaced from the second floating gate finger and the second doped region.

19 Claims, 9 Drawing Sheets

MULTI-FINGER GATE NONVOLATILE MEMORY CELL

FIELD OF THE INVENTION

The disclosed embodiments relate generally to semiconductor memory devices, and more particularly, to a nonvolatile memory with improved program efficiency, larger program/erase window and improved reliability.

BACKGROUND

A nonvolatile memory device retains stored data even if power is turned off. A multiple time programmable (MTP) nonvolatile memory includes electrically erasable programmable read only memory (EEPROM) and flash EEPROM. The memory device comprises a memory transistor having a gate electrode separated from an active region by a dielectric layer.

Programming the memory device may result in injection of electric charges into the gate electrode of the memory transistor to change a threshold voltage of the transistor. Erasing the memory device may expel the injected electric charges from the gate electrode of the memory transistor. During programming, a high voltage may be applied to the gate electrode and to a drain terminal of the memory transistor. A lower voltage may be applied to a source terminal while a substrate terminal of the memory transistor is grounded. The biasing conditions create a strong vertically oriented electric field in a channel region between the source and the drain of the memory transistor resulting in injection of hot electrons to an edge portion of the gate electrode through the dielectric layer from the channel region near the drain. The term "hot electron" may refer to electrons that have gained high kinetic energy after being accelerated by a strong electric field within a semiconductor device. For a typical gate length of 0.55 µm, programming is inefficient resulting in slow programming speed as only a small fraction of electrons may gain high enough kinetic energy to be injected to the gate electrode.

During erasing, a high voltage may be applied to the drain terminal while the gate electrode, source terminal and the substrate terminal are grounded. Electron hole pairs may be generated at the drain region by band to band (BTB) tunneling. The generated holes may be injected into the gate electrode through the dielectric layer from the drain region. Injection of hot electrons and holes to the gate electrode during program and erase operations result in degradation of the dielectric layer near the drain region of the memory device leading to a shorter device lifetime. Thus, there is an urgent need for an improved nonvolatile memory device to overcome the challenges mentioned above.

SUMMARY

In an aspect of the present disclosure, a nonvolatile memory device is provided. The device comprises a floating gate having a first finger and a second finger. An active region may be provided below the floating gate fingers. A first doped region may be provided in the active region laterally displaced from the first floating gate finger on a first side. A second doped region may be provided in the active region laterally displaced from the first floating gate finger on a second side. A third doped region may be provided in the active region laterally displaced from the second floating gate finger and the second doped region.

In another aspect of the present disclosure, a nonvolatile memory device is provided. The device comprises a floating gate having a first finger and a second finger. The first floating gate finger of the device may have a width that is shorter than or equal to a width of the second floating gate finger. Spacer structures may be provided adjacent to sidewalls of the floating gate. An active region may be provided below the floating gate fingers. A first doped region may be provided in the active region laterally displaced from the first floating gate finger on a first side. A second doped region may be provided in the active region laterally displaced from the first floating gate finger on a second side. A third doped region may be provided in the active region laterally displaced from the second floating gate finger and the second doped region.

In yet another aspect of the present disclosure, a method of fabricating a memory device is provided. The method comprises providing an active region and a floating gate having a first finger and a second finger above the active region. A first doped region may be formed in the active region laterally displaced from the first floating gate finger on a first side. A second doped region may be formed in the active region laterally displaced from the first floating gate finger on a second side. A third doped region may be formed in the active region laterally displaced from the second floating gate finger and the second doped region.

Numerous advantages may be provided in the embodiments described below. The narrow width of the first floating gate finger results in increased programming efficiency and faster programming speed due to enhanced impact ionization and a higher generation rate of hot electrons. A small active area below the first floating gate finger leads to a higher coupling ratio further improving the programming efficiency. The improved programming efficiency leads to a larger program/erase window. The term "coupling ratio" may refer to the voltage transfer capability from a coupling n-well capacitor to the floating gate. The term "floating gate" may refer to a gate electrode that is surrounded by an insulator. The term "program/erase window" may refer to a difference between the device threshold voltages after a program and erase cycle.

Programming may include injection of hot electrons to the first floating gate finger while erasing may include injection of hot holes to the second floating gate finger. The device degradation is minimized and the device lifetime and reliability is increased as the hot electrons and holes are injected to different locations of the memory device during program and erase.

BRIEF DESCRIPTION OF THE DRAWINGS

The disclosed embodiments will be better understood from a reading of the following detailed description, taken in conjunction with the accompanying drawings:

FIGS. 7A to 9A illustrate a fabrication process flow for a memory transistor shown in FIG. 1C, according to embodiments of the disclosure.

FIGS. 7B to 9B illustrate a fabrication process flow for an n-well capacitor shown in FIG. 1D, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1A:
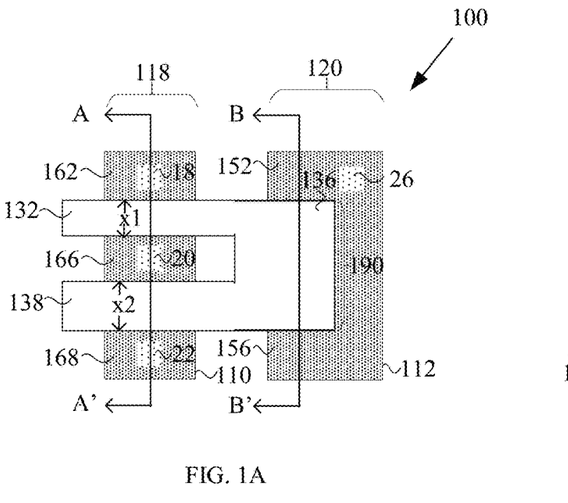
FIG. 1A is a top view of a nonvolatile memory device, according to embodiments of the disclosure.

FIG. 1A is a top view of a nonvolatile memory device 100, according to embodiments of the disclosure. The nonvolatile memory device 100 may be an MTP EEPROM device. Referring to FIG. 1A, the nonvolatile memory device 100 may comprise a memory transistor 118 connected to an n-well capacitor 120. The memory transistor 118 may include a floating gate 190 having at least two floating gate fingers 132 and 138 over an active region 110. The floating gate 190 may be made of an electrically conductive material such as doped polysilicon. Doped regions may be formed in the active region 110. For example, a first doped region 162 may be formed in a portion of the active region 110 adjacent to a portion of the active region 110 under a first floating gate finger 132. A second doped region 166 may be formed in another portion of the active region 110 between the portions of the active region 110 under the first floating gate finger 132 and a second floating gate finger 138. A third doped region 168 may be formed in a portion of the active region 110 adjacent to the portion of the active region 110 under the second floating gate finger 138. The third doped region 168 may be formed on a different side of the second floating gate finger 138 as the second doped region 166. A contact 18 may be formed on the first doped region 162 and may be connected to a bitline. In embodiments, the first doped region 162 may be a drain of the memory transistor 118. Contacts 20 and 22 may be formed on the second doped region 166 and the third doped region 168, respectively. The contact 20 may be connected to a first source line and the contact 22 may be connected to a second source line. The second and third doped regions, 166 and 168, may be a first source and a second source, respectively, of the memory transistor 118. The first, second and third doped regions, 162, 166 and 168, may be connected to separate input terminals for independent control of the drain, first source and second source of the memory transistor 118.

The first floating gate finger 132 may have a width x1 that is shorter than or equal to a width x2 of the second floating gate finger 138. The first floating gate finger 132 and the second floating gate finger 138 may be connected to a section of the floating gate 136 making up an electrode of the n-well capacitor 120. An n-well region 112 may be provided below the floating gate section 136. A doped region 152 or 156 in the n-well region 112 may be formed in a portion of the n-well region 112 adjacent to a portion of the n-well region under the floating gate section 136. The doped region 152 or 156 may be connected to a separate input terminal from the first, second and third doped regions, 162, 166 and 168 in the active region 110. A contact 26 may be formed on the doped region 152 and may be connected to an input terminal to bias the floating gate 190.

In embodiments, the active region 110 may be p-doped. The first, second and third doped regions, 162, 166 and 168 in the active region 110 may be n+ doped. The doped region 152 or 156 in the n-well region 112 may be n+ doped.

Figure 1B:
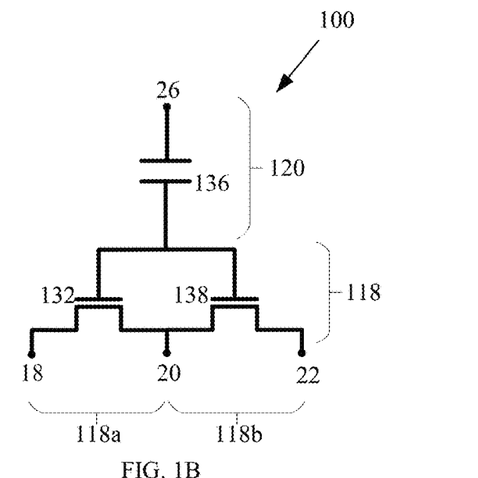
FIG. 1B is a circuit diagram of a nonvolatile memory device, according to embodiments of the disclosure.

FIG. 1B is a circuit diagram of a nonvolatile memory device 100, according to embodiments of the disclosure. Referring to FIG. 1B, the memory device 100 may comprise a memory transistor 118 connected to an n-well capacitor 120. The memory transistor 118 may comprise a first transistor 118a having a first floating gate finger 132 and a second transistor 118b having a second floating gate finger 138. The first floating gate finger 132 and the second floating gate finger 138 may be electrically connected to a section of the floating gate 136 making up an electrode of the n-well capacitor 120. The first transistor 118a and the second transistor 118b may share a first source. Contacts 18, 20, 22 and 26 may be connected to separate input terminals to provide independent control of the drain, first source, second source and the floating gate, respectively, of the memory transistor 118.

Figure 1C:
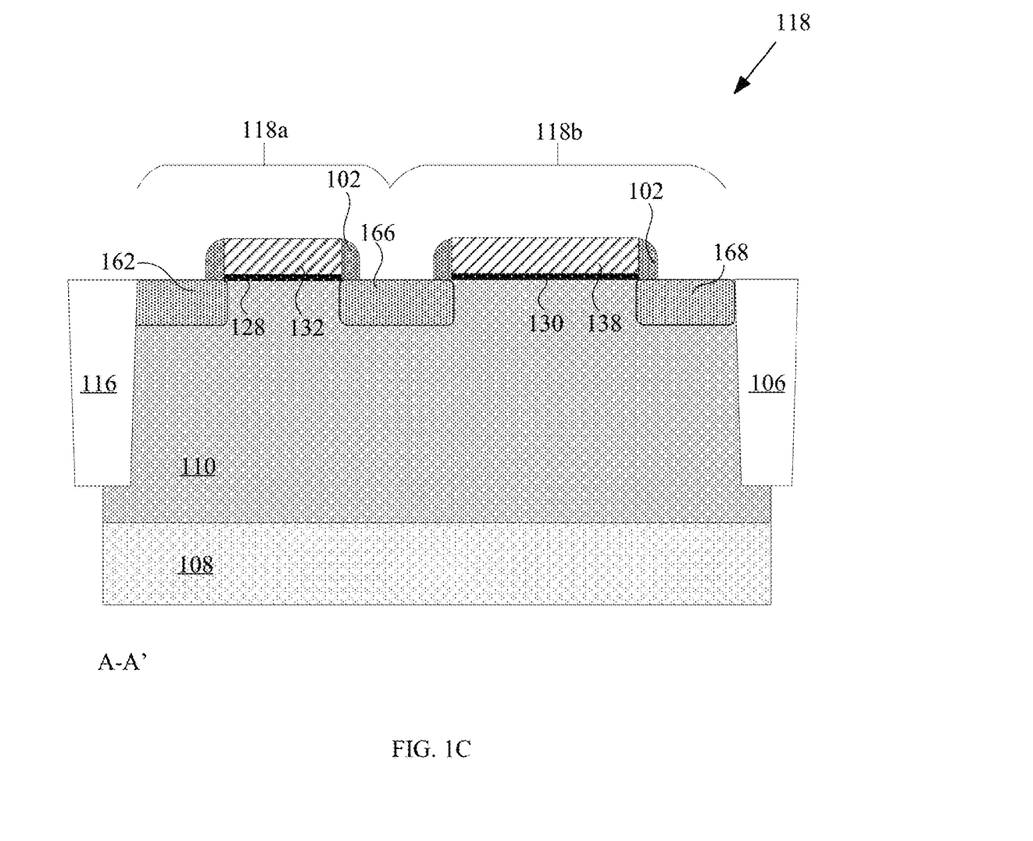
FIG. 1C is a cross-section view of a memory transistor taken along section line A-A' of FIG. 1A, according to embodiments of the disclosure.

FIG. 1C is a cross-section view of a memory transistor 118 taken along section line A-A' of FIG. 1A, according to embodiments of the disclosure. Referring to FIG. 1C, the memory transistor 118 may include a dielectric layer 128 and 130 between the floating gate fingers 132 and 138, respectively, and the active region 110. The dielectric layer 128 and 130 may be made of silicon dioxide. Spacer structures 102 may be formed adjacent to sidewalls of the floating gate fingers 132 and 138. The active region 110 may be formed in a semiconductor substrate 108. Isolation structures 116 and 106 may be formed adjacent to the active region 110 to thereby define the area of the active region 110. The isolation structures 116 and 106 may be shallow trench isolation (STI) structures.

Figure 1D:
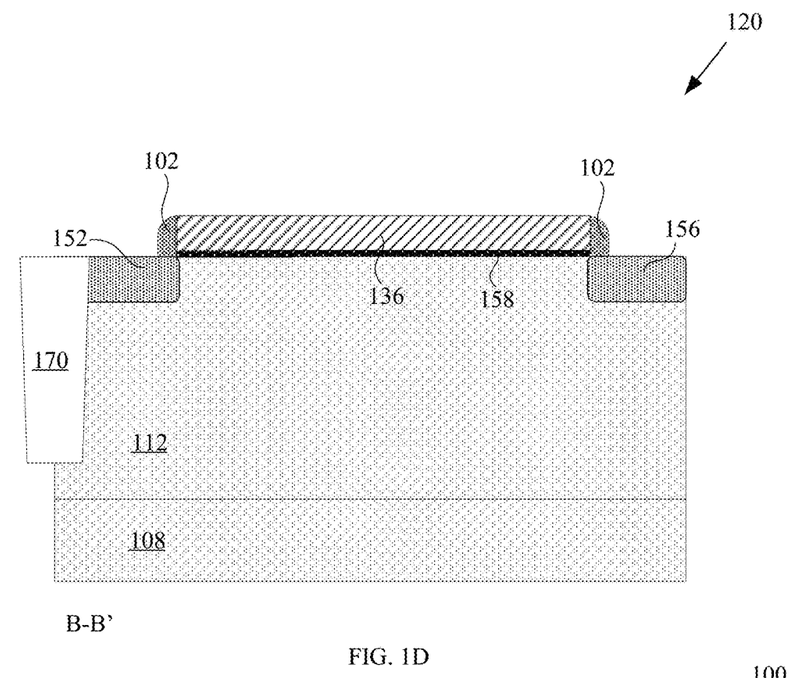
FIG. 1D is a cross-section view of an n-well capacitor taken along section line B-B' of FIG. 1A, according to embodiments of the disclosure.

FIG. 1D is a cross-section view of an n-well capacitor 120 taken along section line B-B' of FIG. 1A, according to embodiments of the disclosure. Referring to FIG. 1D, a dielectric layer 158 may be formed between the floating gate section 136 and the n-well region 112. The dielectric layer 158 may be made of silicon dioxide. Spacer structures 102 may be formed adjacent to sidewalls of the floating gate section 136. The n-well region 112 may be formed in the semiconductor substrate 108. An isolation structure 170 may be formed adjacent to the n-well region 112 to thereby define an area of the n-well region 112. The isolation structure 170 may be an STI structure.

Figure 2:
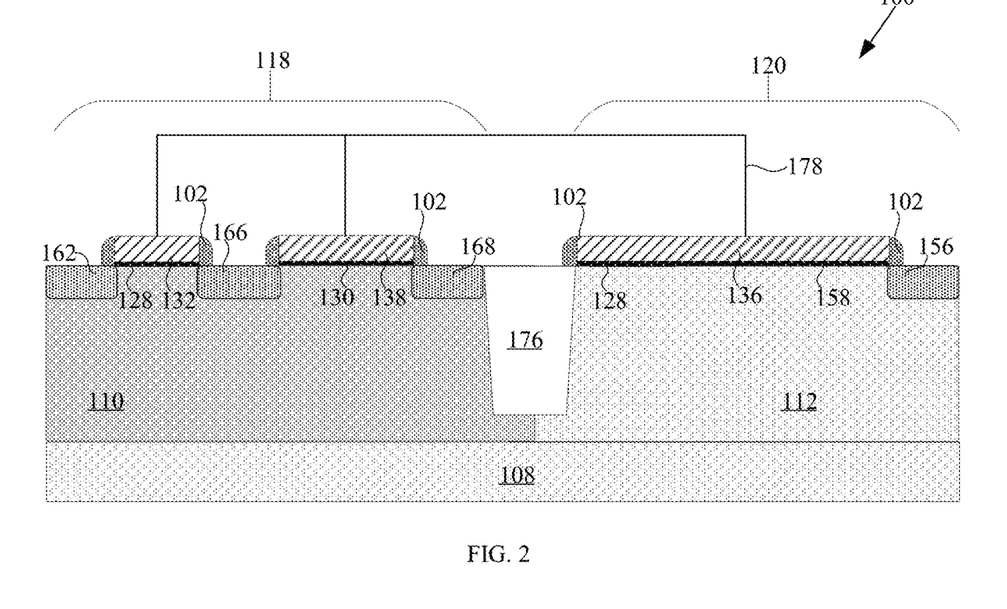
FIG. 2 is a schematic view of a nonvolatile memory device, according to embodiments of the disclosure.

FIG. 2 is a schematic view of a nonvolatile memory device 100, according to embodiments of the disclosure. Referring to FIG. 2, an isolation structure 176 may separate the active region 110 from the n-well region 112. The isolation structure 176 may be an STI structure. A line 178 indicates an electrical connection between the first floating gate finger 132, the second floating gate finger 138 and the floating gate section 136.

TABLE 1

|  | N-well capacitor | Drain | First source | Second source | Active region |
| --- | --- | --- | --- | --- | --- |
| Program | ~9 V | ~9 V | ~4 V | Unselected | 0 V |
| Erase | 0 V | Unselected | 0 V | ~9 V | 0 V |
| Read | 0 to ~3.5 V | Unselected | 0 V | ~1.2 V | 0 V |

Table 1 illustrates an exemplary set of biasing conditions for the nonvolatile memory device 100 shown in FIG. 2. During programming, a bias of approximately 9V may be applied to the n-well capacitor 120 through the doped region 156. A bias of approximately 9V may be applied to the drain or the first doped region 162 of the memory transistor 118. Approximately 4V may be applied to the first source or the second doped region 166 of the memory transistor 118. The second source or the third doped region 168 of the memory transistor 118 may be unselected or floating. The active region 110 may be grounded. The biasing conditions create a strong vertically oriented electric field in a channel region between the first source 166 and the drain 162 of the memory transistor 118. Hot electrons may be generated through impact ionization and are injected into an edge portion of the first floating gate finger 132 near the drain 162 region. The narrower width of the first floating gate finger 132 results in improved generation rate of hot electrons and better programming efficiency. The first floating gate finger 132 may have a width in a range of about 10 nm to about 10 µm.

During erasing, a bias of approximately 9V may be applied to the second source 168 of the memory transistor 118. The drain 162 of the memory transistor 118 may be unselected or floating. The n-well capacitor 120, the first source 166 and the active region 110 may be grounded. The biasing conditions generate electron hole pairs by BTB tunneling near the second source 168. The generated holes are injected to an edge portion of the second floating gate finger 138 near the second source 168 region. The reliability and device lifetime of the memory transistor 118 is improved as the hot electrons and holes are injected to different portions of the memory transistor 118 during program and erase operations.

During reading, a bias of between 0 to 3.5V may be applied to the n-well capacitor 120. Approximately 1.2V may be applied to the second source 168 of the memory transistor 118. The drain 162 of the memory transistor 118 may be unselected or floating. The first source 166 of the memory transistor 118 and the active region 110 may be grounded. A current may be detected at the second source 168 of the memory transistor 118 depending on a threshold voltage value of the memory transistor 118. For example, the threshold voltage of the memory transistor 118 is low after an erase operation and a current may be detected at the second source 168 of the memory transistor 118. A program operation may lead to a high threshold voltage of the memory transistor 118 and less current or negligible current may be detected at the second source 168 of the memory transistor 118. The reading operation detects current generated in a channel region below the second floating gate finger 138. The longer width of the second floating gate finger 138 reduces leakage current and improves readout during the reading operation. The second floating gate finger 138 may have a width in the range of about 10 nm to about 10 µm.

Figure 3:
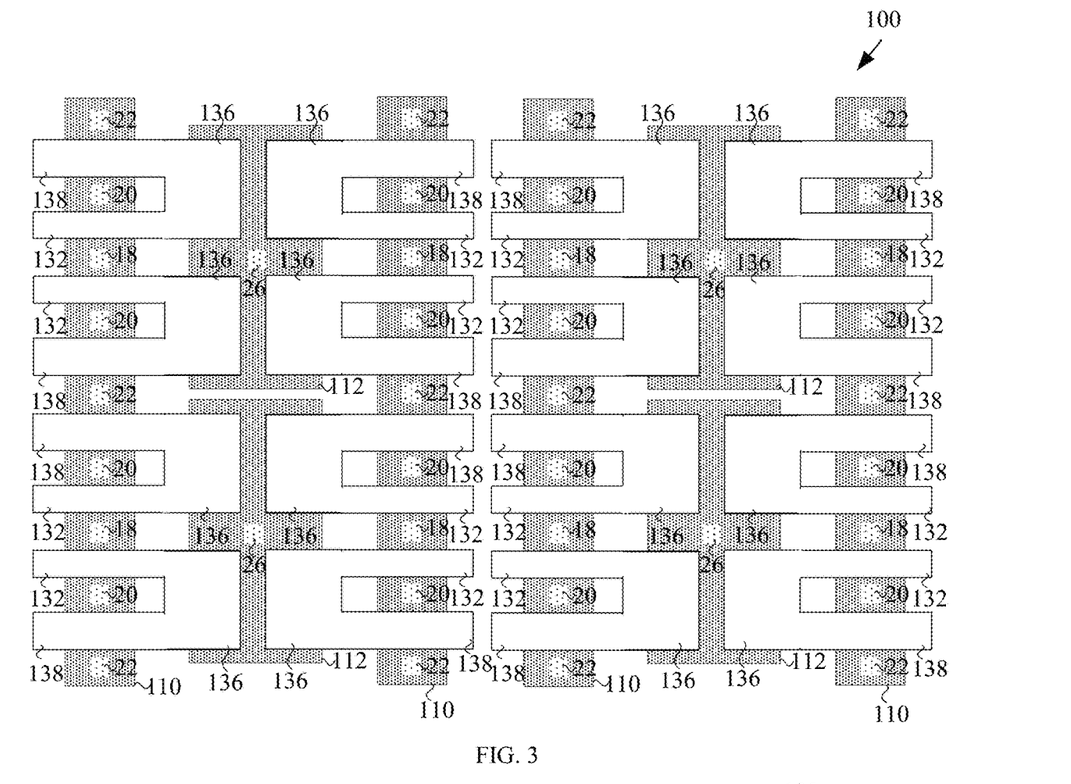
FIG. 3 is a top view of a nonvolatile memory device array, according to embodiments of the disclosure.

FIG. 3 is a top view of a nonvolatile memory device array 100, according to embodiments of the disclosure. There is no minimum design rule restriction for MTP devices thereby the nonvolatile memory device array 100 having the memory transistor 118 with a first and second source 166 and 168, respectively, may have an area that is only up to 20% larger than an array having a memory transistor with a single source. The term "minimum design rule" may refer to a minimum separation between device features. Referring to FIG. 3, although not shown, the contacts 20 may be connected to a first source line and the contacts 22 may be connected to a second source line. The contacts 18 may be connected to a bitline. The contacts 26 may be connected to an input terminal to bias the floating gate.

Figure 4:
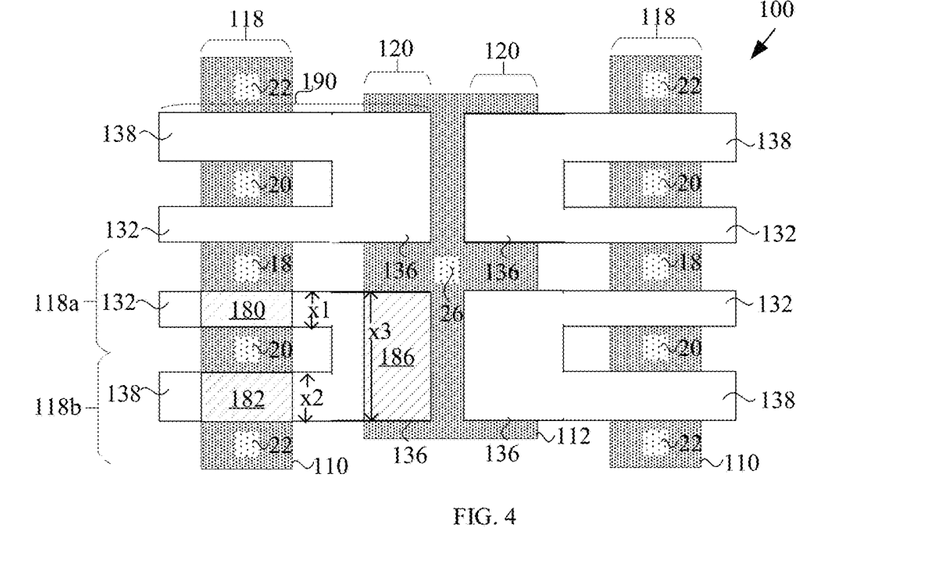
FIG. 4 is a top view of a nonvolatile memory device array showing portions of an active region below a floating gate, according to embodiments of the disclosure.

FIG. 4 is a top view of a nonvolatile memory device array 100 showing portions of an active region 110 below a floating gate 190, according to embodiments of the disclosure. The nonvolatile memory device 100 has improved program efficiency due to a higher coupling ratio. The coupling ratio of the nonvolatile memory device 100 during a programming operation is equivalent to $A_{CO}/(A_{TP}+A_{CO})$ as only the first transistor 118a is selected. $A_{CO}$ refers to an area of a portion 186 of the n-well region 112 below the floating gate section 136. ATP refers to an area of a portion 180 of the active region 110 below the first floating gate finger 132. ATP is smaller than $A_{CO}$ thereby the programming coupling ratio may be in the range of about 60% to about 80%, which is approximately a 20 to 30% improvement compared to conventional nonvolatile memory devices. Referring to FIG. 4, a sum of the width x1 of the first floating gate finger 132 and the width x2 of the second floating gate finger 138 is less than a width x3 of the floating gate section 136.

Figure 5:
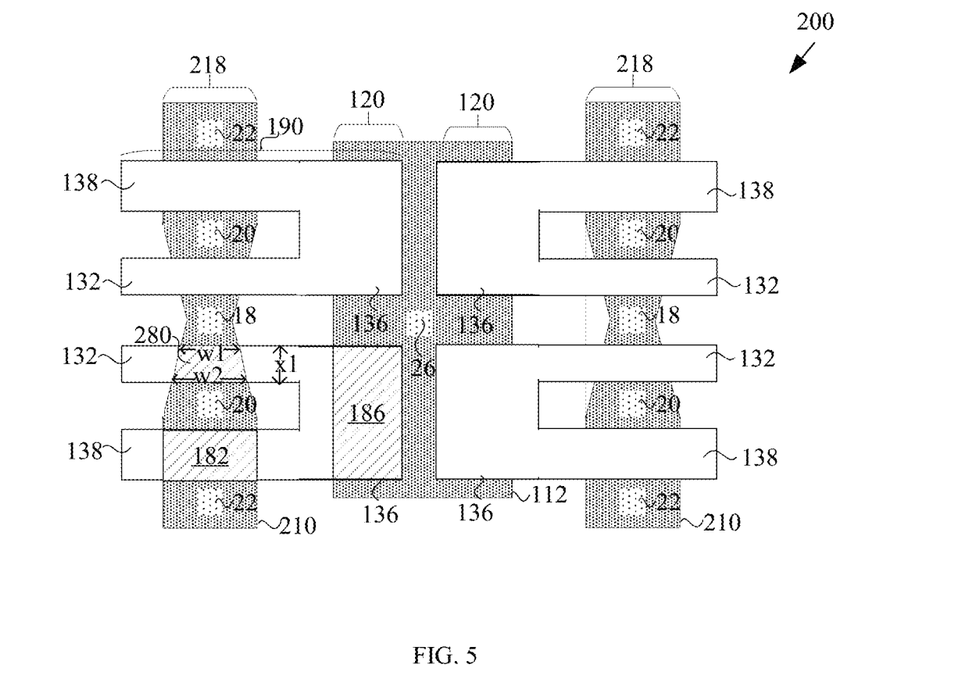
FIG. 5 is a top view of a nonvolatile memory device array showing portions of an active region below a floating gate, according to further embodiments of the disclosure.

The embodiments shown in FIGS. 1 to 4 may be modified to form alternative embodiments without departing from the scope of the disclosure. For example, FIG. 5 is a top view of a nonvolatile memory device array 200 showing portions of an active region 210 below a floating gate 190, according to further embodiments of the disclosure. The same reference numerals used in FIGS. 1 to 4 are also used in FIG. 5 to refer to identical features. In contrast to the nonvolatile memory device array 100 shown in FIG. 4, the active region 210 has varying widths along its length. For example, a portion 280 of the active region 210 below the first floating gate finger 132 has a first width w1 that is shorter than its second width w2. The portion 280 of the nonvolatile memory device 200 has a smaller area than the portion 180 of the nonvolatile memory device 100 shown in FIG. 4 leading to a larger programming coupling ratio and higher programming efficiency. Although not shown, an isolation structure may be formed adjacent to the active region 210 thereby defining the active region 210.

Figure 6:
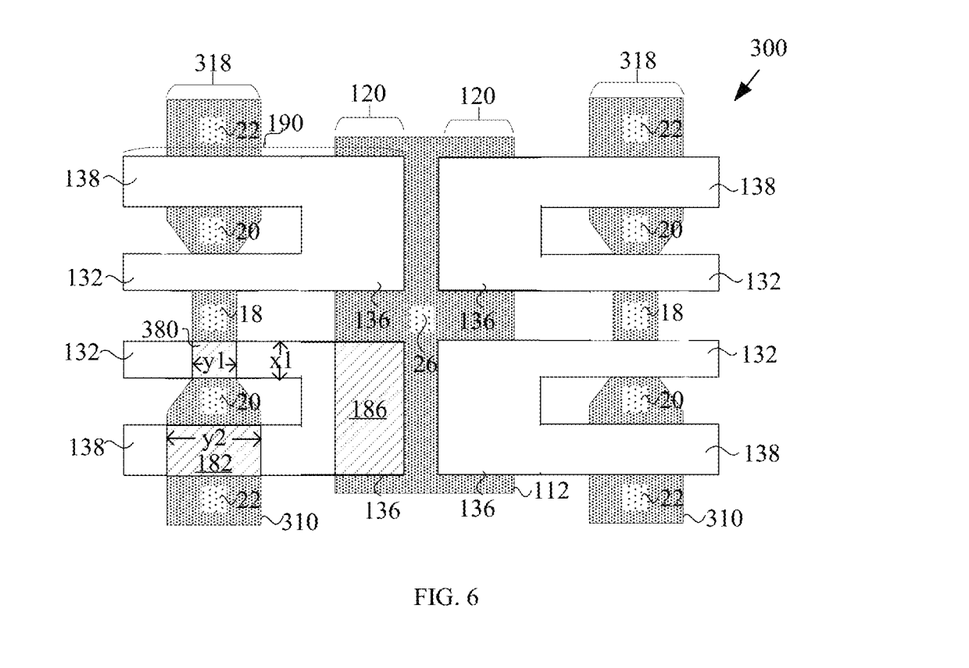
FIG. 6 is a top view of a nonvolatile memory device array showing portions of an active region below a floating gate, according to further embodiments of the disclosure.

FIG. 6 is a top view of a nonvolatile memory device array 300 showing portions of an active region 310 below a floating gate 190, according to further embodiments of the disclosure. Referring to FIG. 6, a portion 380 of the active region 310 below the first floating gate finger 132 has a width y1 that is narrower than a width y2 of a portion 382 of the active region 310 below the second floating gate finger 138. The portion 380 of the nonvolatile memory device 300 has a smaller area than the portion 280 of the nonvolatile memory device 200 shown in FIG. 5 leading to a larger programming coupling ratio and higher programming efficiency.

Figure 7A:
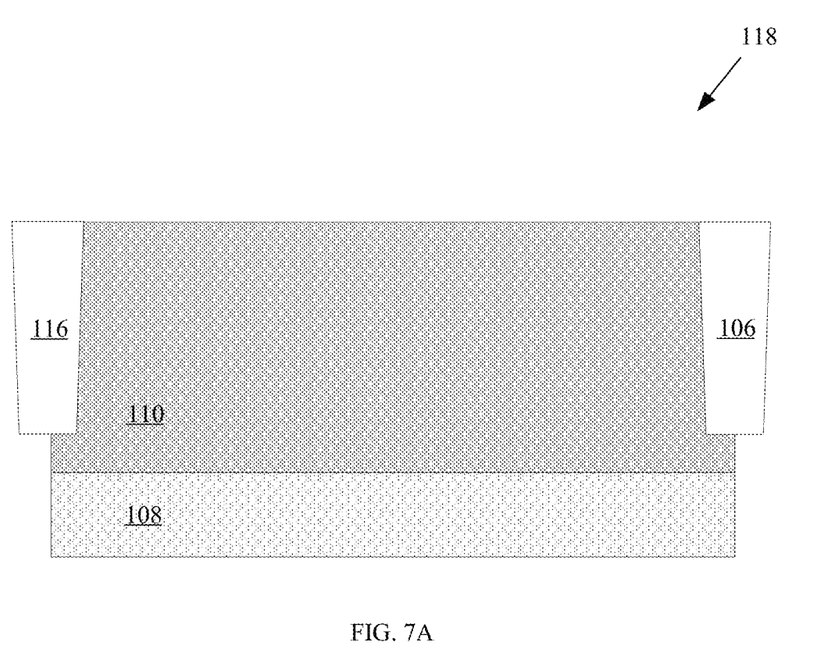

FIGS. 7A to 9A illustrate a fabrication process flow for a memory transistor 118 shown in FIG. 1C, according to embodiments of the disclosure. FIG. 7A is a cross-section view of a partially completed memory transistor 118, according to embodiments of the disclosure. Referring to FIG. 7A, a semiconductor substrate 108 is provided. In embodiments, the semiconductor substrate 108 may be p-doped. Isolation structures 116 and 106 may be formed in the substrate 108. The formation of isolation structures 116 and 106 may include etching isolation trenches in the substrate 108 and filling the isolation trenches with a suitable dielectric material such as silicon dioxide. An active region 110 may be formed in the substrate 108 between the isolation structures 116 and 106. The formation of the active region 110 may include doping with a suitable p-type dopant such as boron followed by activation annealing.

Figure 7B:
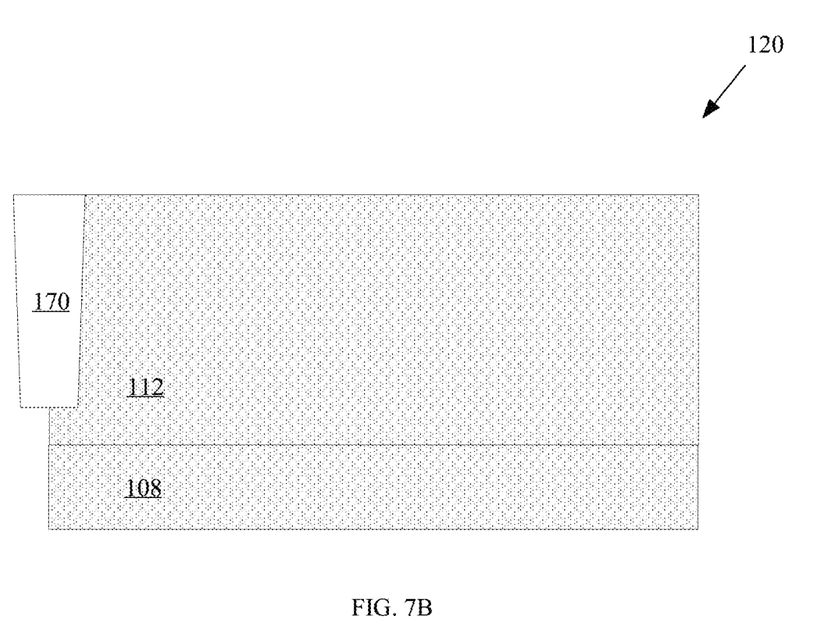

FIGS. 7B to 9B illustrate a fabrication process flow for an n-well capacitor 120 shown in FIG. 1D, according to embodiments of the disclosure. FIG. 7B is a cross-section view of a partially completed n-well capacitor 120, according to embodiments of the disclosure. Referring to FIG. 7B, an isolation structure 170 may be formed in the substrate 108. An n-well region 112 may be formed in the substrate 108 adjacent to the isolation structure 170. The formation of the n-well region 112 may include doping with a suitable n-type dopant such as phosphorus or arsenic.

Figure 8A:
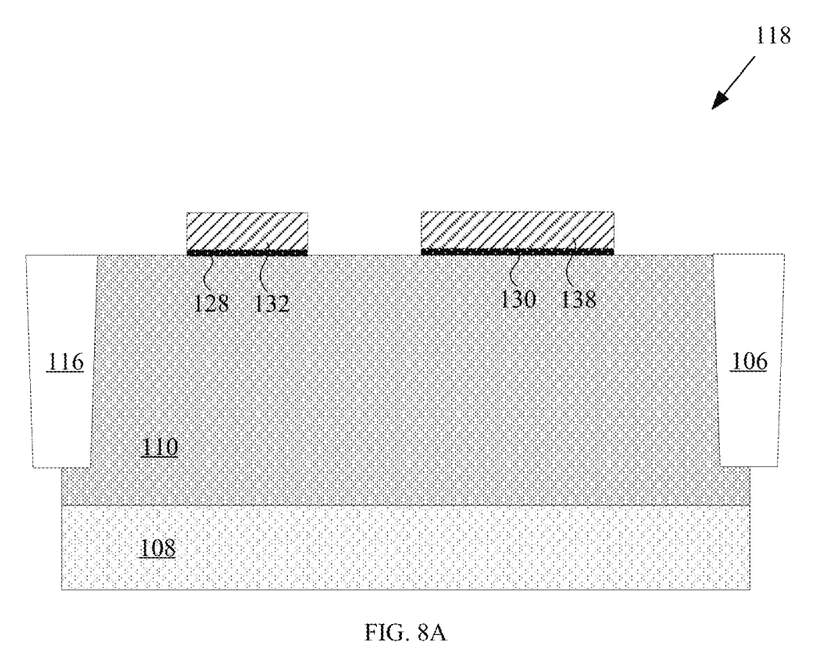

FIG. 8A is a cross-section view of a partially completed memory transistor 118 after formation of a floating gate 190, according to embodiments of the disclosure. Referring to FIG. 8A, a dielectric layer may be formed on the active region 110. A floating gate layer comprising a doped polysilicon layer may be deposited on the dielectric layer. The floating gate layer may be patterned to form a floating gate 190 having at least two fingers 132 and 138 above the active region 110. A wet or dry etch process may be used to remove portions of the dielectric layer not covered by the floating gate 190 to leave behind the dielectric layer 128 and 130 below the floating gate fingers 132 and 138, respectively.

Figure 8B:
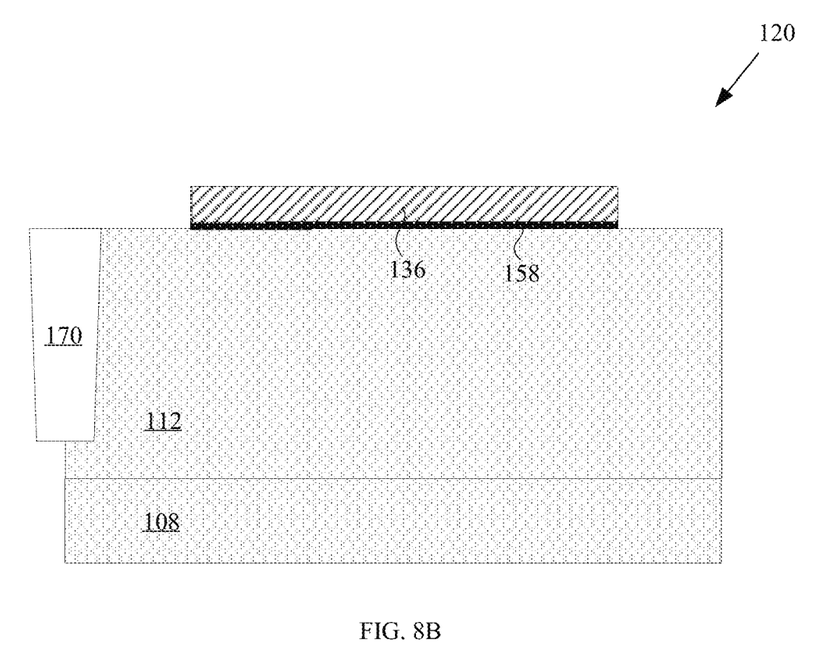

FIG. 8B is a cross-section view of a partially completed n-well capacitor 120 after formation of a floating gate 190, according to embodiments of the disclosure. Referring to FIG. 8B, a dielectric layer may be formed on the n-well region 112 and a floating gate layer may be deposited on the dielectric layer. The formation of the dielectric layer and the floating gate layer above the n-well region 112 of the n-well capacitor 120 and the active region 110 of the memory transistor 118 may be done simultaneously. The floating gate layer may be patterned to form a floating gate section 136. Portions of the dielectric layer not covered by the floating gate section 136 may be removed to leave behind the dielectric layer 158 below the floating gate section 136.

Figure 9A:
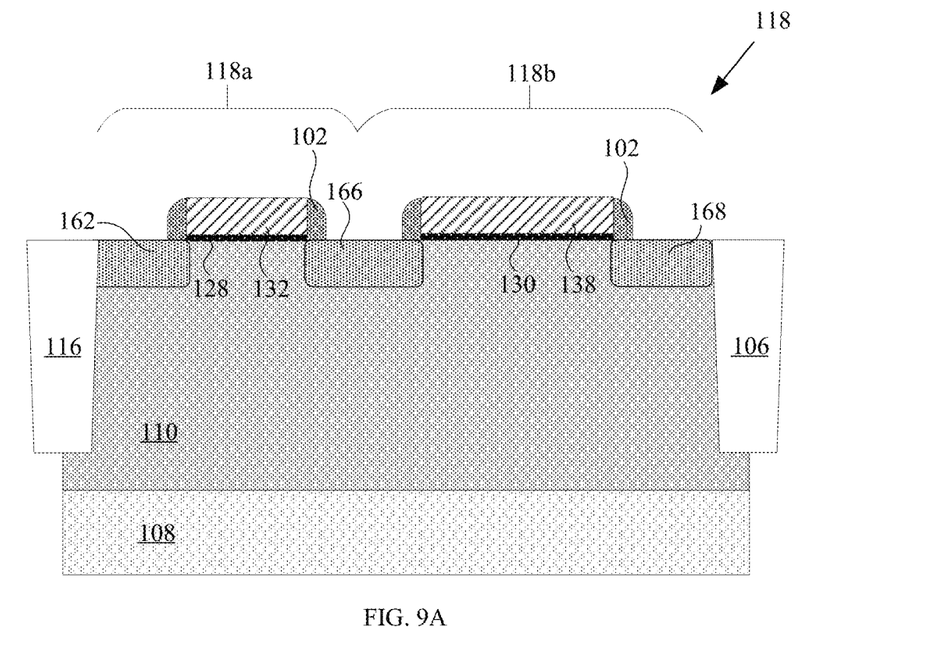

FIG. 9A is a cross-section view of a memory transistor 118 after formation of doped regions 162, 166 and 168 and spacer structures 102, according to embodiments of the disclosure. Referring to FIG. 9A, the spacer structures 102 may be formed adjacent to sidewalls of the floating gate fingers 132 and 138. The formation of spacer structures 102 may include depositing a suitable spacer dielectric layer such as silicon nitride, silicon dioxide, silicon oxynitride, silicon oxycarbonitride or any other suitable dielectric material over the floating gate fingers 132 and 138 followed by anisotropic etching. The term "anisotropic etching" may refer to an etching process that is directional in nature. A first doped region 162 may be formed in a portion of the active region 110 adjacent to a portion of the active region 110 below the first floating gate finger 132 and a second doped region 166 may be formed in another portion of the active region 110 between portions of the active region 110 under the first floating gate finger 132 and the second floating gate finger 138. A third doped region 168 may be formed in a portion of the active region 110 adjacent to a portion of the active region 110 under the second floating gate finger 138. The third doped region 168 may be formed on a different side of the second floating gate finger 138 as the second doped region 166. The formation of the first doped region 162, the second doped region 166 and the third doped region 168 may be by doping with a suitable n+ dopant such as phosphorus or arsenic. Portions of the first doped region 162 and the second doped region 166 may overlap partially with the first floating gate finger 132 due to the doping process. A portion of the third doped region 168 may overlap partially with the second floating gate finger 138.

Figure 9B:
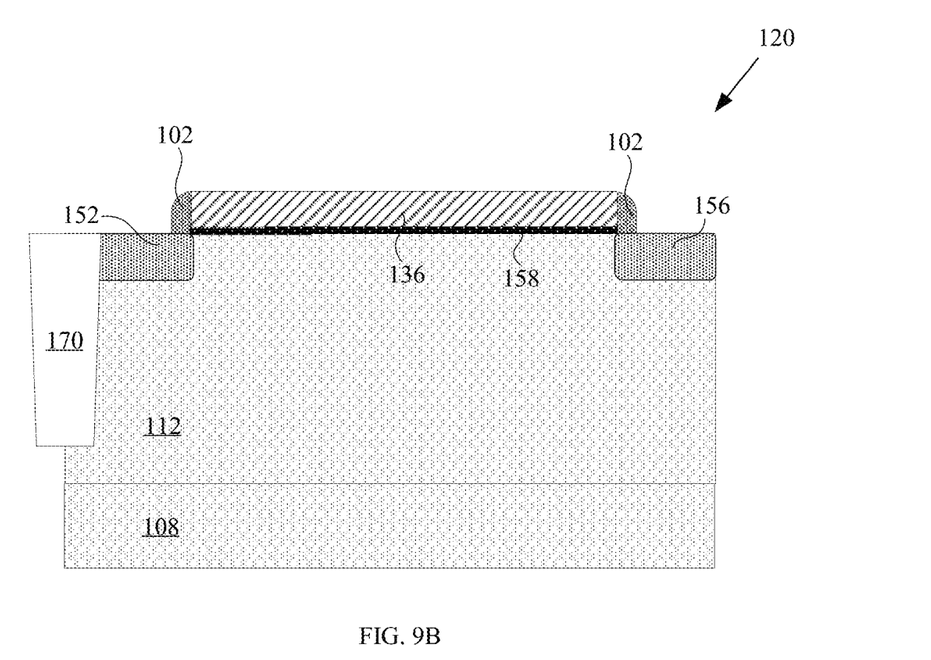

FIG. 9B is a cross-section view of an n-well capacitor 120 after formation of doped regions 152 and 156 and spacer structures 102. The spacer structures 102 of the n-well capacitor 120 may be formed together with the spacer structures 102 of the memory transistor 118. The doped regions 152 and 156 of the n-well capacitor 120 are formed in a portion of the n-well region 112 adjacent to a portion of the n-well region 112 under the floating gate section 136 and may be formed together with the doped regions 162, 166 and 168 of the memory transistor 118.

Figure 10A:
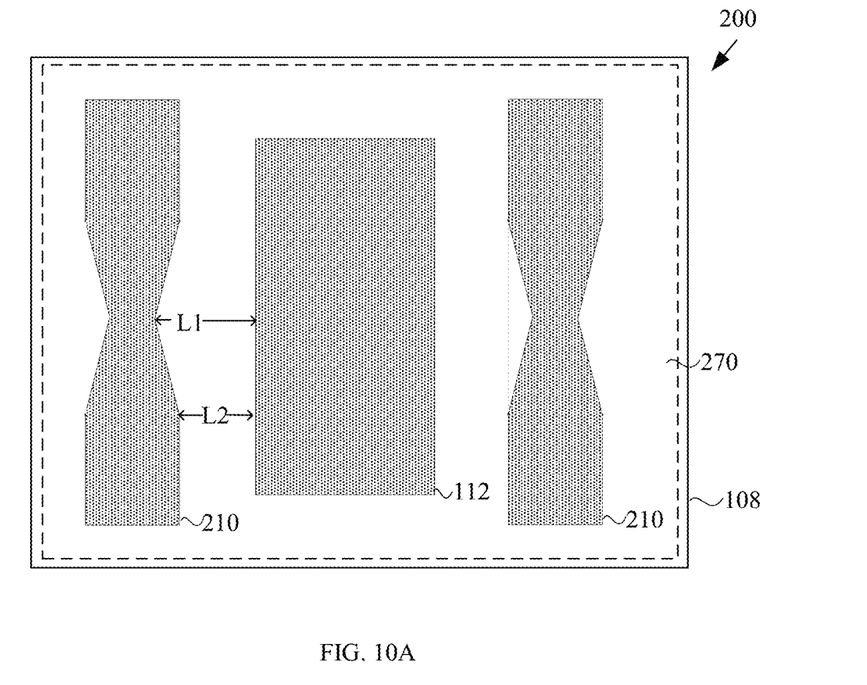
FIGS. 10A and 10B illustrate a fabrication process flow for a nonvolatile memory device array shown in FIG. 5, according to further embodiments of the disclosure.
Figure 10B:
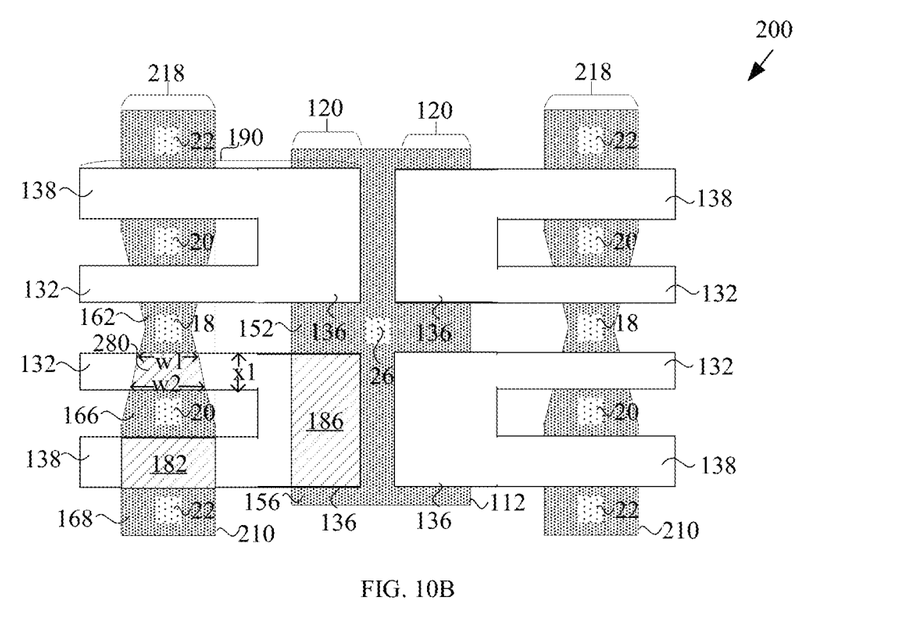

FIGS. 10A and 10B illustrate a fabrication process flow for a nonvolatile memory device array 200 shown in FIG. 5, according to further embodiments of the disclosure. FIG. 10A shows a partially completed nonvolatile memory device array 200 after formation of an active region 210 and an n-well region 112, according to embodiments of the disclosure. Referring to FIG. 10A, a semiconductor substrate 108 is provided. An isolation structure 270, shown as a dashed outline, may be formed in the semiconductor substrate 108. An active region 210 and an n-well region 112 may be formed in the semiconductor substrate 108 and surrounded by the isolation structure 270. A portion of the isolation structure 270 having varying widths along its length may separate the active region 210 and the n-well region 112. A width L1 of the portion of the isolation structure 270 may be wider than a width L2 of the portion of the isolation structure. The isolation structure 270 thereby defines an area of the active region 210 and the n-well region 112.

FIG. 10B shows a nonvolatile memory device array 200 after formation of a memory transistor 218 and an n-well capacitor 120, according to embodiments of the disclosure. For simplicity, the isolation structure 270 and the semiconductor substrate 108 are not shown in FIG. 10B. The formation of the memory transistor 218 may follow the fabrication process flow shown in FIGS. 8A and 9A. The formation of the n-well capacitor 120 may follow the fabrication process flow shown in FIGS. 8B and 9B. Referring to FIG. 10B, a floating gate 190 having at least two fingers 132 and 138 may be formed above the active region 210. A floating gate section 136 connecting the floating gate fingers 132 and 138 may be formed above the n-well region 112. A first doped region 162 may be formed in a portion of the active region 210 adjacent to a portion of the active region 210 under a first floating gate finger 132. A second doped region 166 may be formed in a portion of the active region 210 between portions of the active region 210 under the first floating gate finger 132 and a second floating gate finger 138. A third doped region 168 may be formed in a portion of the active region 210 adjacent to a portion of the active region 210 under the second floating gate finger 138. The third doped region 168 may be formed on a different side of the second floating gate finger 138 as the second doped region 166. Doped regions 152 and 156 may be formed in a portion of the n-well region 112 adjacent to a portion of the n-well region 112 under the floating gate section 136. Contacts 18, 20 and 22 may be formed on the first doped region 162, second doped region 166 and the third doped region 168, respectively. A contact 26 may be formed on the n-well region 112. The formation of the contacts 18, 20, 22 and 26 is well known in the art and will not be further elaborated upon.

Figure 11A:
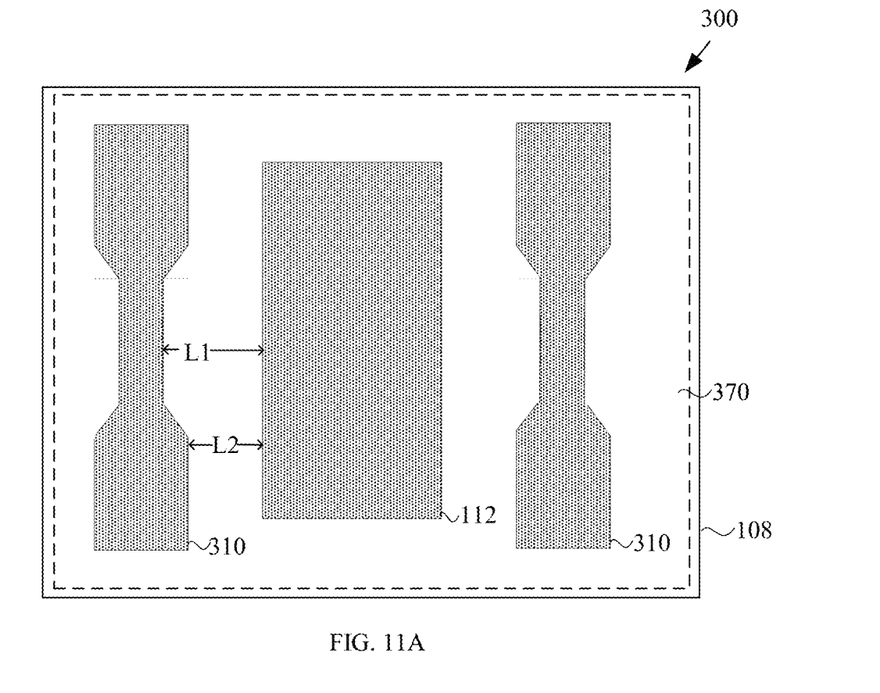
FIGS. 11A and 11B illustrate a fabrication process flow for a nonvolatile memory device array shown in FIG. 6, according to further embodiments of the disclosure.
Figure 11B:
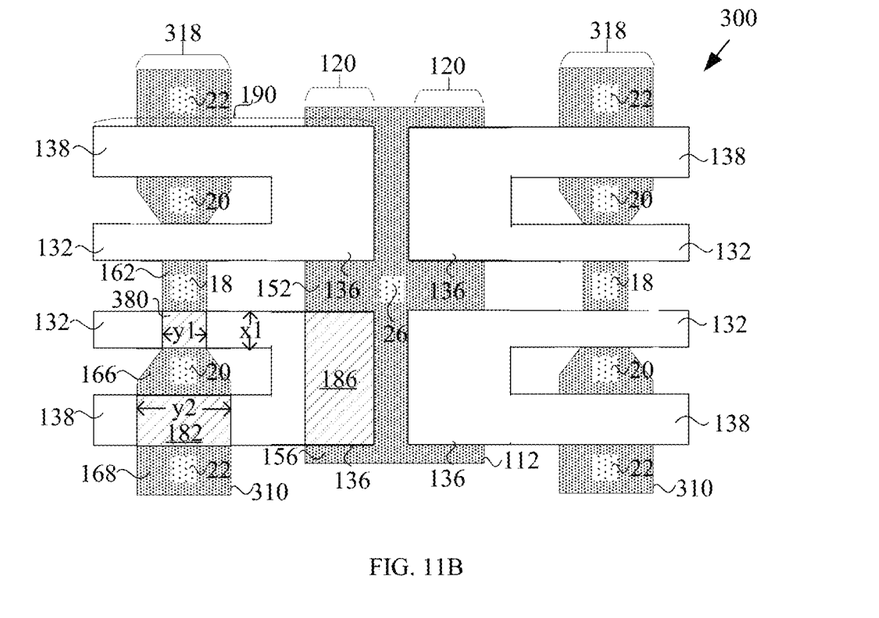

FIGS. 11A and 11B illustrate a fabrication process flow for a nonvolatile memory device array 300 shown in FIG. 6, according to further embodiments of the disclosure. FIG. 11A shows a partially completed nonvolatile memory device array 300 after formation of an active region 310 and an n-well region 112, according to embodiments of the disclosure. Referring to FIG. 11A, a semiconductor substrate 108 is provided. An isolation structure 370 may be formed in the semiconductor substrate 108. An active region 310 and an n-well region 112 may be formed in the semiconductor substrate 108 and surrounded by the isolation structure 370. A portion of the isolation structure 370 having a width L1 may separate a center portion of the active region 310 from the n-well region 112. A portion of the isolation structure 370 having a width L2 which is narrower than L1 may separate upper and lower portions of the active region 310 from the n-well region 112. The center portion of the active region 310 may be narrower than the upper and lower portions of the active region 310.

FIG. 11B shows a nonvolatile memory device array 300 after formation of a memory transistor 318 and an n-well capacitor 120, according to embodiments of the disclosure. For simplicity, the substrate 108 and the isolation structure 370 are not shown in FIG. 11B. The formation of the memory transistor 318 may follow the fabrication process flow shown in FIGS. 8A and 9A. The formation of the n-well capacitor 120 may follow the fabrication process flow shown in FIGS. 8B and 9B. Referring to FIG. 11B, a floating gate 190 having at least two fingers 132 and 138 may be formed above the active region 310. A floating gate section 136 connecting the floating gate fingers 132 and 138 may be formed above the n-well region 112. A first doped region 162 may be formed in a portion of the active region 310 adjacent to a portion of the active region 310 under a first floating gate finger 132. A second doped region 166 may be formed in a portion of the active region 310 between portions of active region 310 under the first floating gate finger 132 and a second floating gate finger 138. A third doped region 168 may be formed in a portion of the active region 310 adjacent to a portion of the active region 310 under the second floating gate finger 138. The third doped region 168 may be formed on a different side of the second floating gate finger 138 as the second doped region 166. Doped regions 152 and 156 may be formed in a portion of the n-well region 112 adjacent to a portion of the n-well region 112 under the floating gate section 136. Contacts 18, 20 and 22 may be formed on the first doped region 162, second doped region 166 and third doped region 168, respectively. A contact 26 may be formed on the n-well region 112.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
    a floating gate having a first floating gate finger and a second floating gate finger;
    an active region below the first floating gate finger and the second floating gate finger, wherein a portion of the active region below the first floating gate finger has a narrower width than a portion of the active region below the second floating gate finger;
    a first doped region in the active region laterally displaced from the first floating gate finger on a first side;
    a second doped region in the active region laterally displaced from the first floating gate finger on a second side; and
    a third doped region in the active region laterally displaced from the second floating gate finger and the second doped region.

2. The nonvolatile memory device of claim 1, wherein the first floating gate finger has a shorter width than the second floating gate finger.

3. The nonvolatile memory device of claim 1, wherein the portion of the active region below the first floating gate finger has a first width that is shorter than a second width.

4. The nonvolatile memory device of claim 1, wherein the first doped region, the second doped region and the third doped region are connected to separate input terminals.

5. The nonvolatile memory device of claim 1 further comprising;
a capacitor comprising a section of the floating gate connected to the floating gate fingers.

6. The nonvolatile memory device of claim 5 further comprising:
an n-well region below the floating gate section.

7. The nonvolatile memory device of claim 6 further comprising:
a doped region in the n-well region laterally displaced from the floating gate section, wherein the doped region in the n-well region is connected to a separate input terminal from the first doped region, the second doped region and the third doped region in the active region.

8. The nonvolatile memory device of claim 6 further comprising:
an isolation structure separating the active region from the n-well region.

9. The nonvolatile memory device of claim 6 further comprising:
a dielectric layer between the floating gate section and the n-well region.

10. The nonvolatile memory device of claim 7, wherein the doped region in the n-well region is n+ doped.

11. The nonvolatile memory device of claim 1, wherein the active region is p-doped.

12. The nonvolatile memory device of claim 11, wherein the first doped region, the second doped region and the third doped region are n+ doped.

13. The nonvolatile memory device of claim 1 further comprising:
a dielectric layer between the floating gate fingers and the active region.

14. A nonvolatile memory device comprising:
a floating gate having a first floating gate finger and a second floating gate finger, wherein the first floating gate finger has a width that is shorter than or equal to a width of the second floating gate finger;
spacer structures adjacent to sidewalls of the floating gate;
an active region below the first floating gate finger and the second floating gate finger, wherein a portion of the active region below the first floating gate finger has a narrower width than a portion of the active region below the second floating gate finger;
a first doped region in the active region laterally displaced from the first floating gate finger on a first side;
a second doped region in the active region laterally displaced from the first floating gate finger on a second side; and
a third doped region in the active region laterally displaced from the second floating gate finger and the second doped region.

15. The nonvolatile memory device of claim 14 further comprising:
a capacitor comprising a section of the floating gate connected to the first floating gate finger and the second floating gate finger.

16. The nonvolatile memory device of claim 15, wherein a sum of the width of the first floating gate finger and the width of the second floating gate finger is less than a width of the floating gate section.

17. A method of fabricating a nonvolatile memory device comprising:
providing an active region;
providing a floating gate having a first floating gate finger and a second floating gate finger above the active region wherein a portion of the active region below the first floating gate finger has a narrower width than a portion of the active region below the second floating gate finger;
forming a first doped region in the active region laterally displaced from the first floating gate finger on a first side;
forming a second doped region in the active region laterally displaced from the first floating gate finger on a second side; and
forming a third doped region in the active region laterally displaced from the second floating gate finger and the second doped region.

18. The method of claim 17, wherein providing the active region further comprises:
providing a substrate;
forming an isolation structure in the substrate; and
forming the active region in the substrate adjacent to the isolation structure.

19. The method of claim 18, wherein providing the floating gate having the first finger and the second finger above the active region further comprises:
forming a floating gate layer above the active region; and
patterning the floating gate layer to form the floating gate having the first finger and the second finger above the active region.

* * * * *